(12) United States Patent
Raynor

(10) Patent No.: US 10,535,695 B2
(45) Date of Patent: Jan. 14, 2020

(54) STACKED WAFER ARRANGEMENT FOR GLOBAL SHUTTER PIXELS UTILIZING CAPACITIVE DEEP TRENCH ISOLATIONS

(71) Applicant: STMicroelectronics (Research & Development) Limited, Marlow, Buckinghamshire (GB)

(72) Inventor: Jeffrey M. Raynor, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 0 days.

(21) Appl. No.: 15/919,838

(22) Filed: Mar. 13, 2018

(65) Prior Publication Data

US 2019/0288023 A1 Sep. 19, 2019

(51) Int. Cl.
*H01L 27/146* (2006.01)
*H01L 27/30* (2006.01)
*H04N 5/363* (2011.01)
*H04N 5/378* (2011.01)

(52) U.S. Cl.
CPC .... *H01L 27/14634* (2013.01); *H01L 27/1463* (2013.01); *H01L 27/14636* (2013.01); *H01L 27/307* (2013.01); *H04N 5/363* (2013.01); *H04N 5/378* (2013.01)

(58) Field of Classification Search
CPC ........... H01L 27/14634; H01L 27/1463; H01L 27/14636; H01L 27/307; H04N 5/363; H04N 5/378
See application file for complete search history.

(56) References Cited

U.S. PATENT DOCUMENTS

| | | | | |
|---|---|---|---|---|
| 2007/0099391 A1* | 5/2007 | Cheng | ................. | H01L 27/1087 438/400 |
| 2013/0087683 A1* | 4/2013 | Mo | ........................ | H04N 5/355 250/208.1 |
| 2013/0147007 A1* | 6/2013 | Booth, Jr. | ......... | H01L 27/10829 257/508 |
| 2014/0035083 A1* | 2/2014 | Wan | .................. | H01L 27/14634 257/432 |
| 2014/0361347 A1* | 12/2014 | Kao | .................. | H01L 27/14687 257/226 |

(Continued)

OTHER PUBLICATIONS

Kondo, Toru, et al.: "A 3D Stacked CMOS Image Sensor With 16Mpixel Global-Shutter Mode Using 4 Million Interconnections," Proceedings of 2015 International Image Sensor Workshop (IISW) Vaals, The Netherlands, Date: Jun. 8-11, 2015 (4 pages).

*Primary Examiner* — Amy R Hsu
(74) *Attorney, Agent, or Firm* — Crowe & Dunlevy

(57) ABSTRACT

Described herein is an electronic device that includes a first integrated circuit die having formed therein at least one photodiode and readout circuitry to convert charge generated by the at least one photodiode to a read voltage and to selectively output the read voltage. A second integrated circuit die is in a stacked arrangement with the first integrated circuit die and has formed therein storage circuitry to selectively transfer the read voltage to at least one storage capacitor for storage as a stored voltage and to selectively transfer the stored voltage to an output. The at least one storage capacitor is formed from a capacitive deep trench isolation. There is an interconnect between the first and second integrated circuit dies for coupling the readout circuitry to the storage circuitry.

25 Claims, 16 Drawing Sheets

(56) References Cited

U.S. PATENT DOCUMENTS

| | | | |
|---|---|---|---|
| 2015/0145102 A1* | 5/2015 | Dyer | H01L 27/10829 257/532 |
| 2015/0295005 A1* | 10/2015 | Tseng | H01L 27/14638 257/446 |
| 2015/0296158 A1* | 10/2015 | Mansoorian | H04N 5/374 348/308 |
| 2015/0318322 A1* | 11/2015 | Borthakur | H01L 27/14634 348/294 |
| 2017/0251153 A1* | 8/2017 | Roffet | H04N 5/35581 |
| 2018/0152644 A1* | 5/2018 | Kondo | H04N 5/345 |
| 2018/0269276 A1* | 9/2018 | Lin | H01L 27/10823 |

* cited by examiner

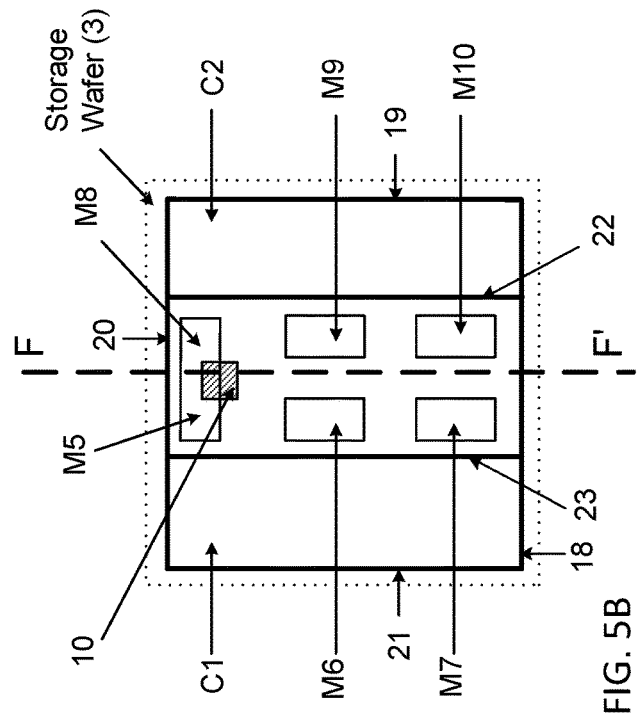
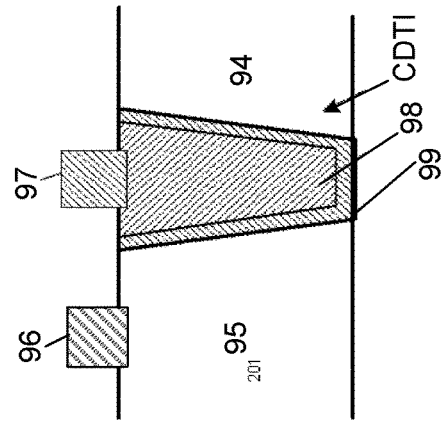
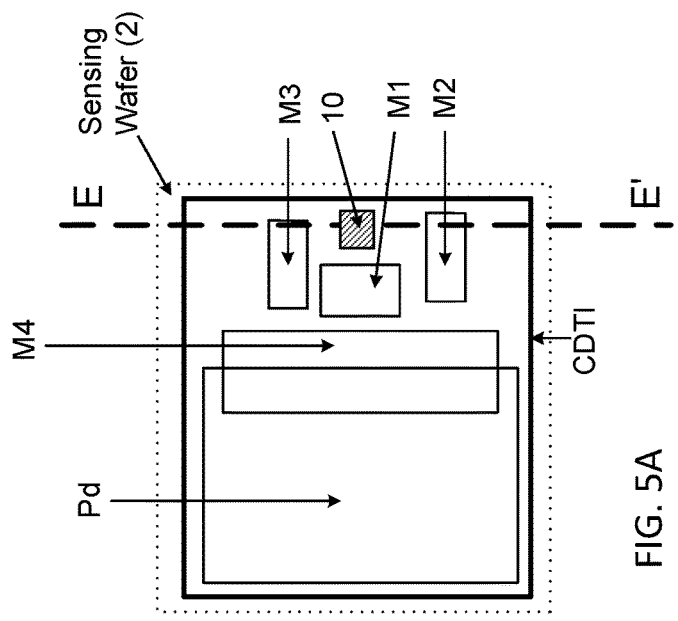
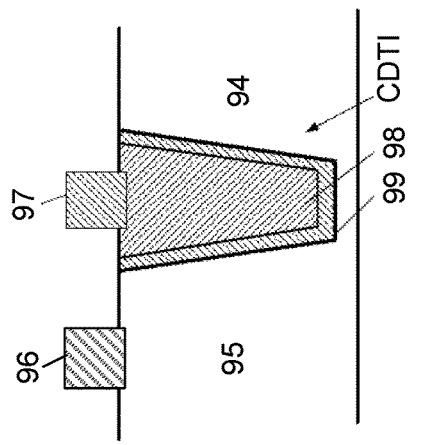
FIG. 5B
FIG. 6B
FIG. 5A
FIG. 6A

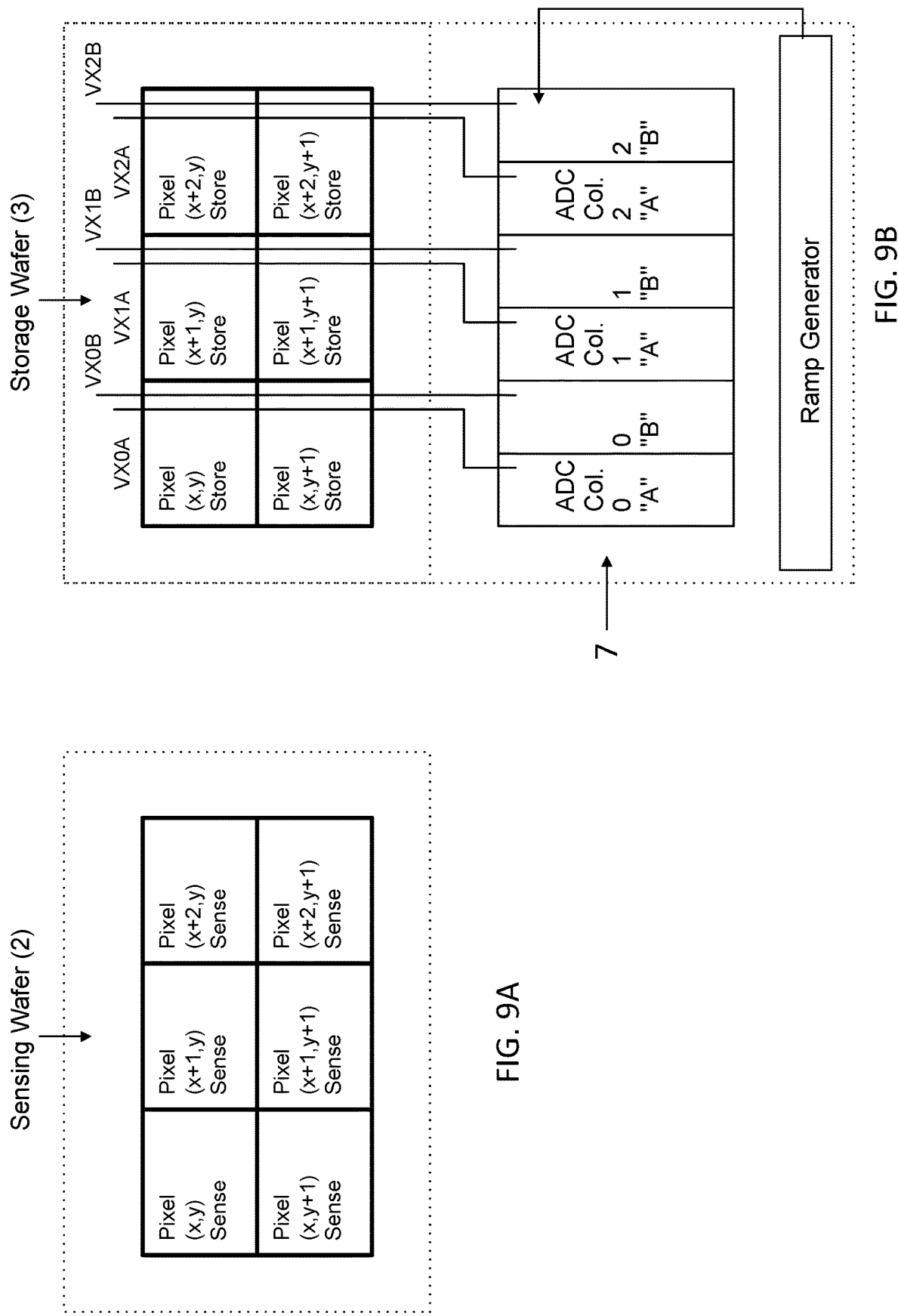

STACKED WAFER ARRANGEMENT FOR GLOBAL SHUTTER PIXELS UTILIZING CAPACITIVE DEEP TRENCH ISOLATIONS

TECHNICAL FIELD

Disclosures herein relate to image sensors and layouts therefor that reduce area for a given pixel size.

BACKGROUND

Digital photography has overtaken traditional film based photography as the routine means by which images are taken and stored. Initially confined to single purpose camera devices, over time digital cameras incorporated into cellular phones grew increasingly popular, and at the present time, the majority of digital images captured by individuals for non-commercial purposes are captured using a digital camera incorporated within a cellular phone. Accordingly, as the desire for cellular phones capable of acting as digital cameras grew, the desire for the digital images captured by those cellular phones to be of higher quality grew.

For years, the image sensors used within the digital camera systems of cellular phones increased in resolution (i.e. pixel count), with top of the line cellular phones incorporating image sensors having more than 16 million pixels (MP), and in one case, over 40 MP.

This increase in resolution was accomplished in part by shrinking the size of individual pixels. This in turn, in prior art designs, resulted in each pixel having a reduced charge storage capacity, which means that each pixel captures less light. Since the maximum signal to nose ratio is a function of the square root of the charge storage capacity, these smaller pixels ultimately result in a worse signal to noise ratio.

Consequently, the trend to greater numbers of smaller pixels began to reverse, and the current trend is toward larger pixels with greater charge storage capacity. Since image sensors for cellular phones are desired to be small and compact, the challenge is therefore to design sensors with larger pixels of sufficient count (resolution), yet keep the sensor size as compact as possible.

Due to this challenge, rolling blade operated type pixels are commonly employed instead of global shutter operated pixels, due to the traditionally smaller area occupied by rolling blade shutter pixels. However, as will be explained, rolling blade shutter pixels have drawbacks compared to global shutter pixels.

In a rolling blade shutter, an array of pixels are processed line by line, with one being integrated and another being read out for each movement of the shutter. The shutter moves over the array so that the pixels are exposed for the same amount of time, but not at the same moment in time. Therefore, it is evident that a rolling blade shutter may not work well when taking images of fast moving objects.

With a global shutter, the pixels of the array are simultaneously released from reset and start to integrate simultaneously. As a result, the drawbacks of a rolling blade shutter are not present. After a specific period, the pixels are then read out simultaneously into a temporary storage, which may be located inside the pixel. This temporary storage is then scanned out row by row where the signal is amplified or converted into a digital value.

Since the pixels integrate simultaneously, each pixel has at least one dedicated storage capacitor, and in more advanced cases, each pixel may have two dedicated storage capacitors. An example ten transistor global shutter pixel with two output bit lines VX0A and VX0B is shown in FIG. 1. The pixel 1 includes a number of transistors M1 to M11, the functions of which will be set out in more detail below. It should be noted that the capacitors C1 and C2 are shown as being MOS transistors configured to act as capacitors, but may also be metal-insulator-metal capacitors. The pixel 1 also includes a photodiode Pd, a floating diffusion capacitor Cfd, and input and output lines (VDD, VRT, TG, VBIAS, READ1, SAMPLE1, SAMPLE2 and RESET).

M4 is a transfer gate transistor to transfer charge during pixel reset from VRT (flowing through M2) to the photodiode Pd, and during pixel readout to transfer charge from the photodiode Pfd to the floating diffusion capacitor Cfd. M2 is used to reset the floating diffusion capacitor Cfd and if TG is high, the photodiode Pd is also reset if RST is simultaneously asserted.

M1 is a source-follower where the voltage on the source of M1 follows the voltage on the gate of M1, which is set by the voltage across the floating diffusion capacitor Cfd. M5 is an active load for M1 to help ensure it operates correctly. To save power, it is possible to pull VBIAS low when the pixels are not being read out so that M1 is not used.

Transistor M6 is used as a switch and when enabled, allows the voltage at the source of M1 to be stored on the capacitor C1. As stated, C1 can be a metal-insulator-metal capacitor (as shown in FIG. 2), but as the capacitor is storing a voltage and not a charge and is followed by a source-follower transistor (M7), it does not need to be linear and hence the gate of a MOS transistor can be used as the capacitor (as shown in FIG. 1A). M7 is a source follower for the voltage on the storage capacitor C1.

M9 provides the same functionality as M6, but for a second storage site at capacitor C2. M10 provides the same functionality as M7, but for the second storage site. C2 can be a metal-insulator-metal capacitor or metal-insulator-metal capacitor and provides the same functionality as C1, but for the second storage site.

M3 is a read transistor and is enabled when the signal from the corresponding row is required. It is disabled when another row in the sensor is being accessed. M11 provides the same functionality as M3, but for the second storage site.

The use of the two storage capacitors C1 and C2 enables two separate images to be handled separately, as they are written to and read from independently. The two storage capacitor C1 and C2 are each written to respectively at first and second times, which times correspond to the successive frames captured. These storage capacitors C1 and C2 are traditional two plate capacitors.

As shown, the pixel 1 is formed on a single wafer 2. The result of this is that the pixel size is large, leading to a reduced number of pixels for a given area. Therefore, while an image sensor made using the design of this pixel 1 has advantages in terms of improved signal to noise ratio, as well as the capabilities afforded by the independently writeable and independently readable capacitors, such an image sensor would have drawbacks in terms of total resolution. Since higher resolutions permit a higher degree of digital zooming, as well as display of larger images without visible quality degradation, it would be desirable to overcome these drawbacks, and to have the advantages of this pixel design without the drawbacks. Accordingly, further development has been needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is an electronic device that includes a first integrated circuit die having formed therein at least one photodiode and readout circuitry. The readout circuitry is configured to convert charge generated by the at least one photodiode to a read voltage and to selectively output the read voltage. The electronic device also includes a second integrated circuit die in a stacked arrangement with the first integrated circuit die and having formed therein storage circuitry. The storage circuitry is configured to selectively transfer the read voltage to at least one storage capacitor for storage as a stored voltage and to selectively transfer the stored voltage to an output. The at least one storage capacitor is formed from a capacitive deep trench isolation. An interconnect is between the first and second integrated circuit dies for coupling the readout circuitry to the storage circuitry.

Different configurations for the readout circuitry and storage circuitry are possible. In one potential configuration the readout circuitry in the first integrated circuit die includes a floating diffusion capacitor, a transfer gate transistor configured to selectively transfer charge generated by the at least one photodiode to the floating diffusion capacitor as the read voltage, a first source follower configured to stabilize and output the read voltage, and an active load transistor coupled between the first source follower and a bias voltage. In addition, in this potential configuration, the storage circuitry formed in the second integrated circuit die includes at least one storage capacitor, a switch transistor configured to transfer the read voltage output by the first source follower to the at least one storage capacitor as a stored voltage, and a second source follower configured to stabilize and output the stored voltage to the output.

The readout circuitry formed in the first integrated circuit die further may also include first and second storage capacitors, a switch transistor configured to transfer the read voltage output by the first source follower to the first and second storage capacitors as a stored voltage, and a third source follower configured to stabilize and output the stored voltage at the first and second storage capacitors to the output. The at least one storage capacitor formed in the second integrated circuit die may include third and fourth storage capacitors.

In another configuration of the readout and storage circuitry, the readout circuitry may include a floating diffusion capacitor, a transfer gate transistor configured to selectively transfer charge generated by the at least one photodiode to the floating diffusion capacitor as the read voltage, a first source follower configured to stabilize and output the read voltage, and an active load transistor coupled between the first source follower and a bias voltage. In this configuration, the storage circuitry may include first, second, third, and fourth storage capacitors, first, second, third, and fourth switch transistors respectively configured to transfer the read voltage output by the first source follower to the first, second, third, and fourth storage capacitors as a stored voltage, and second, third, fourth, and fifth source followers respectively configured to stabilize and output the stored voltage from the first, second, second, and third storage capacitors to the output.

In yet another configuration, the readout circuitry formed in the first integrated circuit die may include a floating diffusion capacitor, a transfer gate transistor configured to selectively transfer charge generated by the at least one photodiode to the floating diffusion capacitor as the read voltage, and a first source follower configured to stabilize and output the read voltage to the interconnect. In this configuration, the storage circuitry formed in the second integrated circuit die may include an active load transistor coupled between the interconnect and a bias voltage, at least one storage capacitor, a switch transistor configured to transfer the read voltage output by the first source follower to the at least one storage capacitor as a stored voltage, and a second source follower configured to stabilize and output the stored voltage to the output.

Many more variations are possible. This summary is not intended to limit the scope of this disclosure.

BRIEF DESCRIPTION OF THE DRAWINGS

FIG. 5A is a top plan view of another design for the sensing wafer of FIG. 2.

FIG. 5B is a top plan view of another design for the storage wafer of FIG. 2.

FIG. 6A is a cross sectional view of a sample capacitive deep trench isolation usable with any of the pixels described herein, as formed from a partial thickness process.

FIG. 6B is a cross sectional view of a sample capacitive deep trench isolation usable with any of the pixels described herein, as formed from a full thickness process

FIG. 9A is a top view block diagram of one design for the sensing wafer of FIG. 2.

FIG. 9B is a top view block diagram of one design for the storage wafer of FIG. 2.

DETAILED DESCRIPTION

One or more embodiments of the present disclosure will be described below. These described embodiments are only examples of the presently disclosed techniques. Additionally, in an effort to provide a concise description, all features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

This disclosure is directed to a layout and structure for cells of an image sensor utilizing a global shutter, in which sensing and storage portions of the circuit are on separate IC's, providing multiple benefits, both in terms of performance as well as space savings. It should be noted that any pixel suitable for use with a global shutter may be used in this layout. In fact, pixels suitable for rolling shutter may also in some cases be used with this layout.

Figure 1:
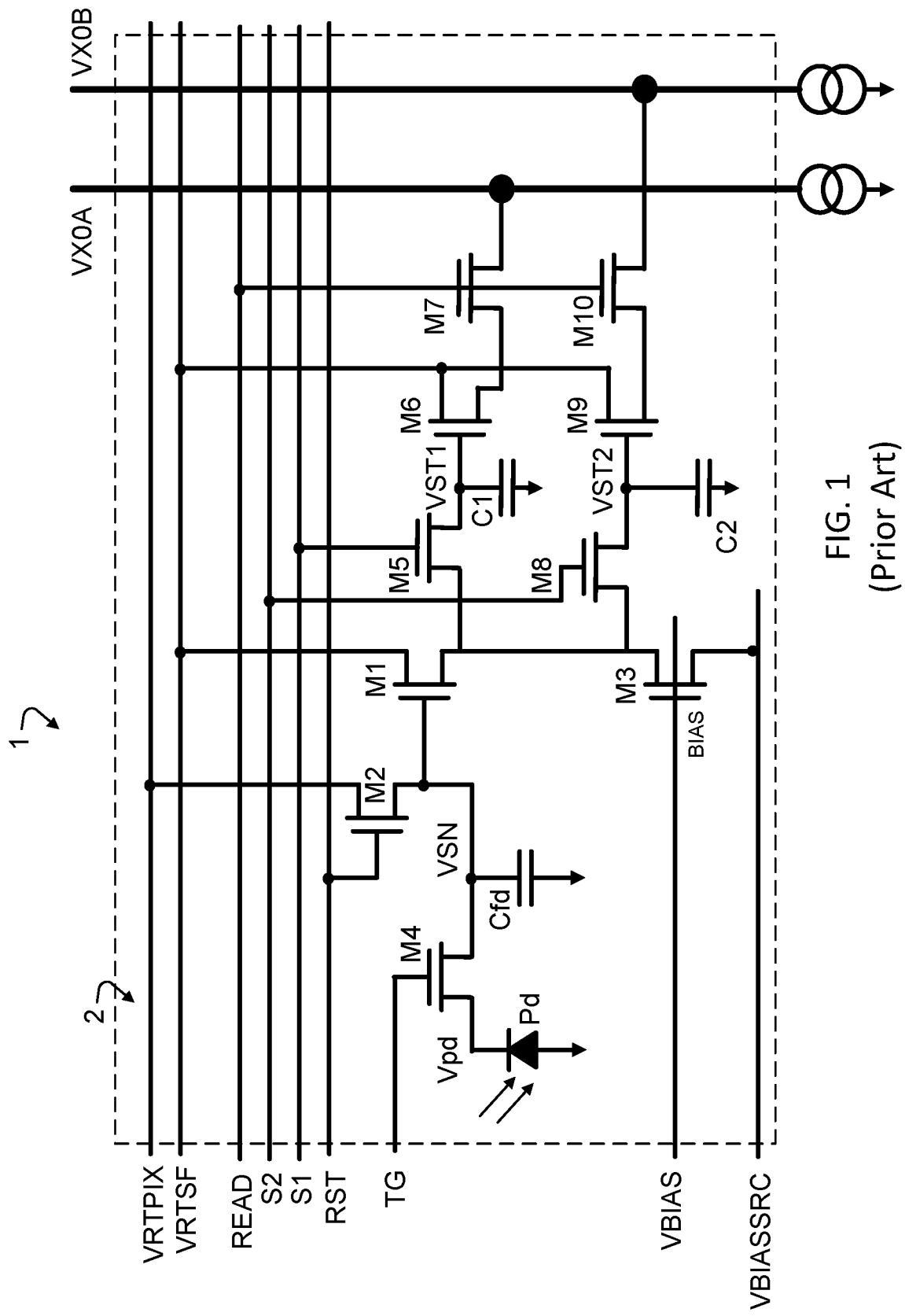
FIG. 1 is a circuit diagram of a ten transistor pixel architecture circuit, in accordance with the prior art.
Figure 2:
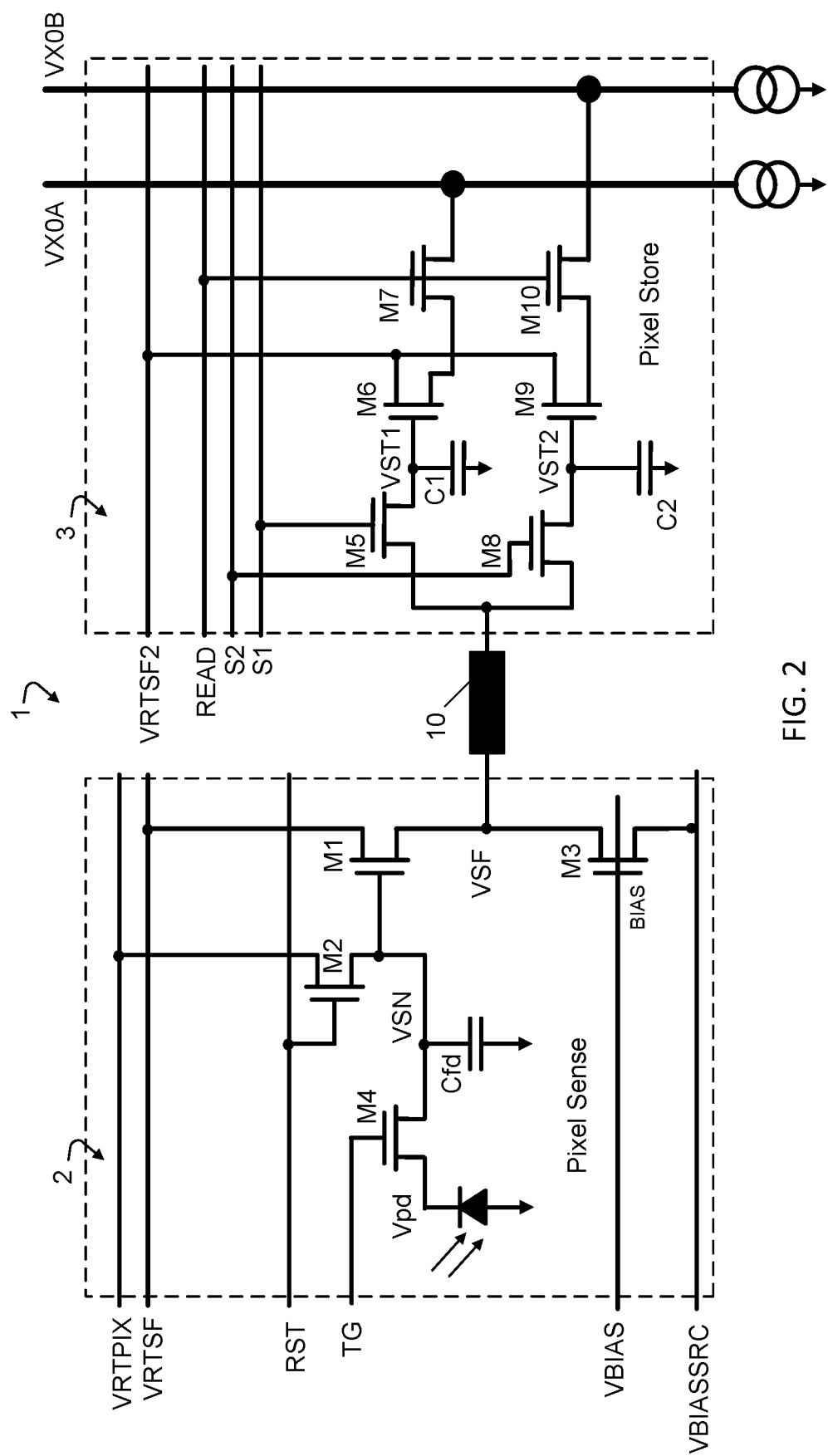
FIG. 2 is a circuit diagram of a ten transistor pixel architecture circuit similar to that of FIG. 1 in which a sensing portion of the circuit is on a first integrated circuit die (IC) and a storage portion of the circuit is on a second integrated circuit die (IC), in accordance with this disclosure.

So as to address the drawbacks present in conventional ten transistor pixel designs such as that of FIG. 1, as shown in FIG. 2, the Inventor has split the pixel 1 into two parts, with the circuitry related to imaging (photodiode Pd, diffusion capacitor Cfd, and transistors M1, M2, M4), also referred to pixel sense circuitry, formed in one wafer (or integrated circuit die) 2, and with the circuitry related to storage (capacitors C1 and C2, transistors M3, M5, M6, M7, M9, M10, and M11), also referred to as pixel store circuitry, formed on another wafer (or integrated circuit die) 3, with the wafers being stacked and a single interconnection 10 being therebetween. These wafers 2 and 3 are formed as separate, distinct components. An advantage of this design is that issues due to parasitic light sensitivity (of parasitic diodes formed by drains of transistors M6 and M9) are eliminated, meaning that due to the stacked wafers 2 and 3, photo-generated charge is not collected by the parasitic diodes as they are physically shielded from light.

The processes used for forming the waters 2 and 3, and the components respectively therein and thereon, may be the same processes, resulting in a same pitch between the components and circuits on both wafers 2 and 3.

The storage wafer 3 may, and in some applications does, contain transistors arranged into logic gates and configured to perform logic functions. Also, in some applications, the storage wafer 3 may contain transistors arranged into an analog to digital converter configured to convert the values stored in the capacitors C1 and C2 into digital format.

The imaging wafer 2 does not contain storage capacitors C1 and C2, or circuitry for transferring the voltage across the floating diffusion capacitor Cfd (as output by source follower M1) to the storage capacitors C2 and C2. Likewise, the storage wafer 3 does not contain circuitry for collecting light or transforming photodiode charge into voltage.

It should be understood that any transistor shown on the sensing wafer 2, as well as any structure that performs an equivalent function, is not integrated on or in the storage wafer 3. Likewise, any capacitor, transistor, or circuit shown on storage wafer 3, as well as any structure that performs an equivalent function, is not integrated on or within the sensing wafer 2.

Figure 3:
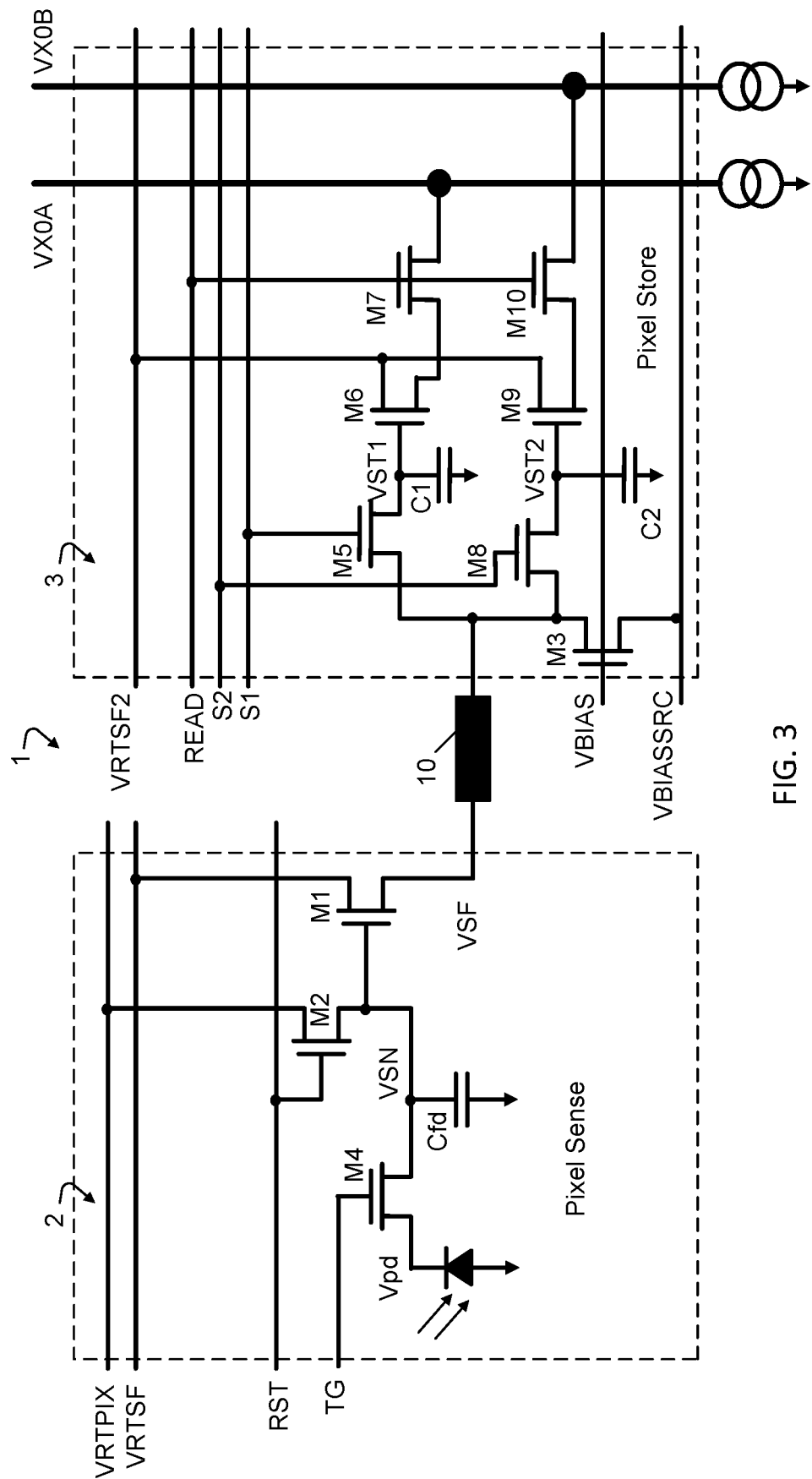
FIG. 3 is a circuit diagram of a ten transistor pixel architecture circuit similar to that of FIG. 2 in which the active load is on the second IC rather than the first IC.

One variant is shown in FIG. 3. Here, transistor M3 is located on the storage wafer 3 as opposed to the imaging wafer 2. While this reduces available space for the storage capacitors C1 and C2, it does provide for easier routing of the conductors VRTSF and VBIASRC (since they are on different wafers) and room to make these conductors larger so as to provide for reduced resistance, which is desirable as these conductors are to pass large amounts of current.

Figure 4A:
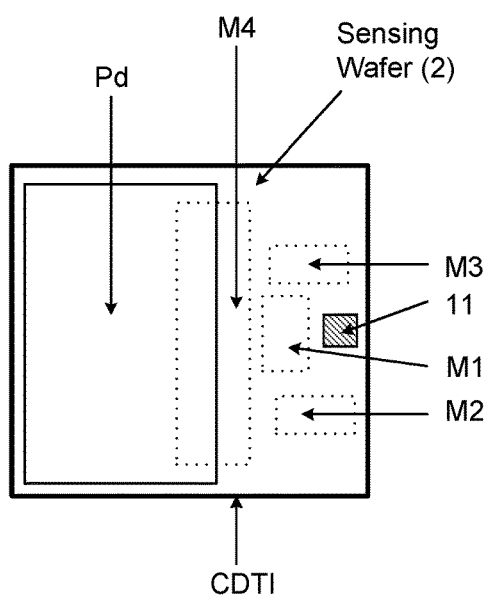
FIG. 4A is a top plan view of one design for the sensing wafer of FIG. 2.

A first possible top plan view of the sensing wafer 2 (if the pixel variant shown in FIG. 2 is used) is shown in FIG. 4A. Here, it can be seen that a capacitive deep trench isolation structure CDTI surrounds the components on the sensing wafer 2, namely the photodiode Pd, and transistors M1-M4.

Figure 4B:
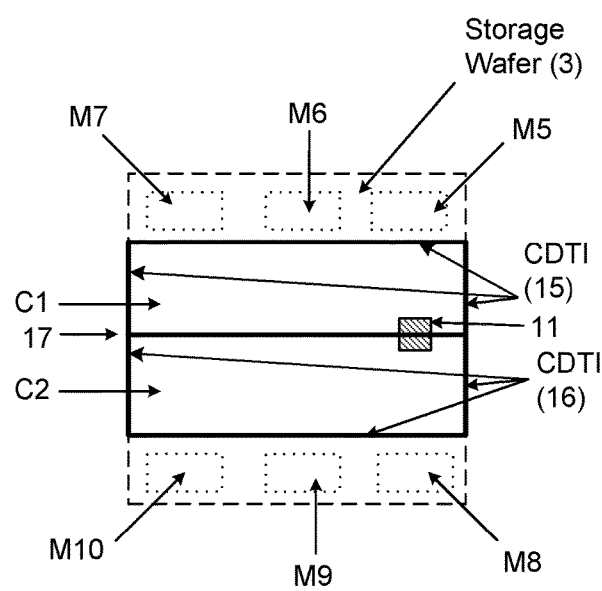
FIG. 4B is a top plan view of one design for the storage wafer of FIG. 2.

A first possible top plan view of the storage wafer 3 (if the pixel variant shown in FIG. 2 is used) is shown in FIG. 4B. Here, it can be observed that capacitors C1 and C2 are respectively formed from capacitive deep isolation structures 15 and 16 that share a wall 17. Likewise, it can be observed that the transistors M5-M10 are located outside of the deep trench isolation structures 15 and 16, and that the interconnect 10 is coupled to both capacitor C1 and capacitor C2.

An alternate top plan view for pixel structure 1 shown in FIG. 2 is depicted in FIG. 5A. A capacitive deep trench isolation structure CDTI surrounds the components on the sensing wafer 2, namely the photodiode Pd, and transistors M1-M4. A possible top plan view of the storage wafer 3 (if the pixel variant shown in FIG. 2 is used) to be mated with the sensing wafer 2 in FIG. 5A is shown in FIG. 5B. Here, capacitors C1 and C2 are respectively formed from capacitive deep trench isolation structures (similar to those shown in FIG. 6B). In particular, capacitor C1 has one plate formed from the area interior to the deep trench isolation structures 18, 23, 20, and 21, with its other plate formed from the deep trench isolation structures 18-23 themselves. Similarly, capacitor C2 has one plate formed from capacitive deep trench isolation structures 18, 19, 20, and 22. Therefore, it is noted that portions of the capacitive deep trench isolation structures 18 and 20 are shared by both capacitors C1 and C2. It is also noted that the transistors M5-M10, as well as the interconnect 10 are surrounded by the capacitive deep trench isolation structures 18, 20, 22, and 23, and although this arrangement where the transistors M5-M10 are surrounded by the capacitive deep trench isolation structures is desirable, it is not requisite for proper functioning of the storage wafer 3.

A sample capacitive deep trench isolation CDTI is shown in FIG. 6A. Here, the CDTI is formed from a partial thickness process, and it can be observed that a CDTI is formed in silicon substrate 95 from a trench surrounding a doped region 94 of the silicon substrate 95. The CDTI has its interior walls coated with an insulator 99 and then filled with a conductor 98. Therefore, a capacitor is formed by the doped region 94, insulator 99, and conductor 98. Contact 97 is coupled to the conductor 98, and contact 96 is coupled to the doped region 94. Of note is that, owing to the partial thickness process, the trench (and thus the insulator 99) does not extend completely through the silicon substrate 95. This results in the doped region 94 and the silicon substrate 95 being at the same potential, leaving conductor 97 as a floating terminal. The partial thickness process produces a CDTI shaped as a straight line or finger.

Differently, as shown in FIG. 6B, were the CDTI formed from a full thickness process, the trench (and thus insulator 99) extends completely through the silicon substrate 95, and the doped region 94 and the silicon substrate 95 would be isolated from one another. This would leave the doped region as the pixel ground, the contact 96 as a terminal, and the contact 97 as a virtual ground. The full thickness process produces a CDTI shaped as a ring, such as C1 and C2 shown in FIG. 4B.

The advantage of using a capacitive deep trench isolation to form a capacitor is that a greater capacitance per area can be achieved, thereby allowing capacitors of a greater capacitance to be formed in a same area than with prior art capacitor designs.

Of note in each of the top plan views described is that the storage capacitors are formed from capacitive deep trench isolations, and not MOS (metal oxide semiconducting) or metal-on-metal capacitors.

Figure 7:
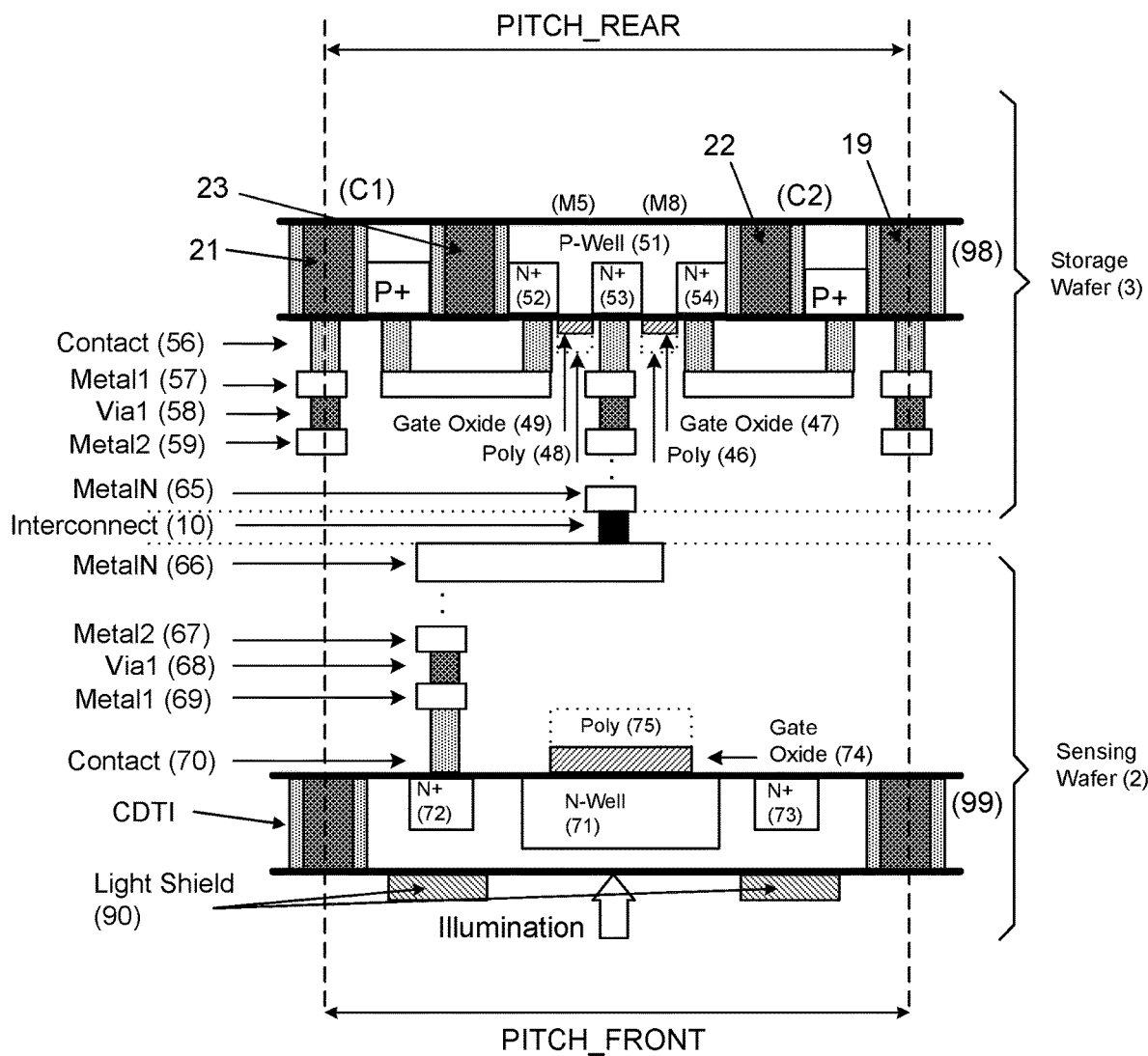
FIG. 7 is a cross sectional view of the sensing wafer and storage wafer of FIG. 2 in which the capacitive deep trench isolations of those wafers are aligned.

A cross section through lines E and F of FIGS. 5A-5B is shown in FIG. 7. As explained, the circuitry response for image acquisition is on the sensing wafer 2, and the circuitry responsible for storage is on the storage wafer 3. The sensing wafer 2, as shown, illustrates one of the transistors M1-M4 as including a p-type substrate 99, source 72 and drain 73 regions formed in the substrate 99, and a gate region (N-well) 71 formed in the substrate 99. A gate oxide 74 is formed above the gate region 71, with a polysilicon layer 75 formed on the gate oxide 74.

Contacts 70 within the imaging wafer 1 electrically couple the source 72 region to first metallizations 69, which are in turn electrically coupled to second metallizations 67 through vias 68. Not shown for brevity are other vias and metallizations which serve to electrically couple the second metallizations 67 to the top metallization layer 66. As shown in this example, the top metallization layer 66 is exposed on a surface of the sensing wafer 2.

An interconnect 10, such as a conductive bump, couples the metallization layer 65 of the storage wafer 3 to the metallization layer 66 of the sensing wafer 2. In the storage wafer 3, contacts 56, metallization 57, via 58, and additional metallization 59 layers serve to relay signals between the transistor M5 and capacitor C1 and transistor M6 and transistor C2.

Capacitor C1 is formed from a p-doped region between the capacitive deep trench isolation regions 23. Similarly, capacitor C2 is formed from a p-doped region between the capacitive deep trench isolation regions 22 and 19.

NMOS transistors M5 and M8 are shown as being formed within the storage wafer 3. Transistors M5 and M8 share a p-well 51, and have a common source-drain region 53. Transistor M5 also includes source-drain region 52, while transistor M8 also includes source-drain region 54. A gate oxide 49 of transistor M5 is formed between source-drain regions 52 and 53, with a polysilicon layer 48 formed on the source gate oxide 49. Similarly, a gate oxide 47 of transistor M9 is formed between source-drain regions 53 and 54, with a polysilicon layer 46 formed on the gate oxide 46.

As can be observed, the capacitive deep trench isolations 21 and 19 of the storage wafer 3 are aligned with the capacitive deep trench isolations CDTI of the sensing wafer 2. In addition, as can be observed, the pitch of the storage wafer 3 is identical to that of the sensing wafer 2.

Figure 8:
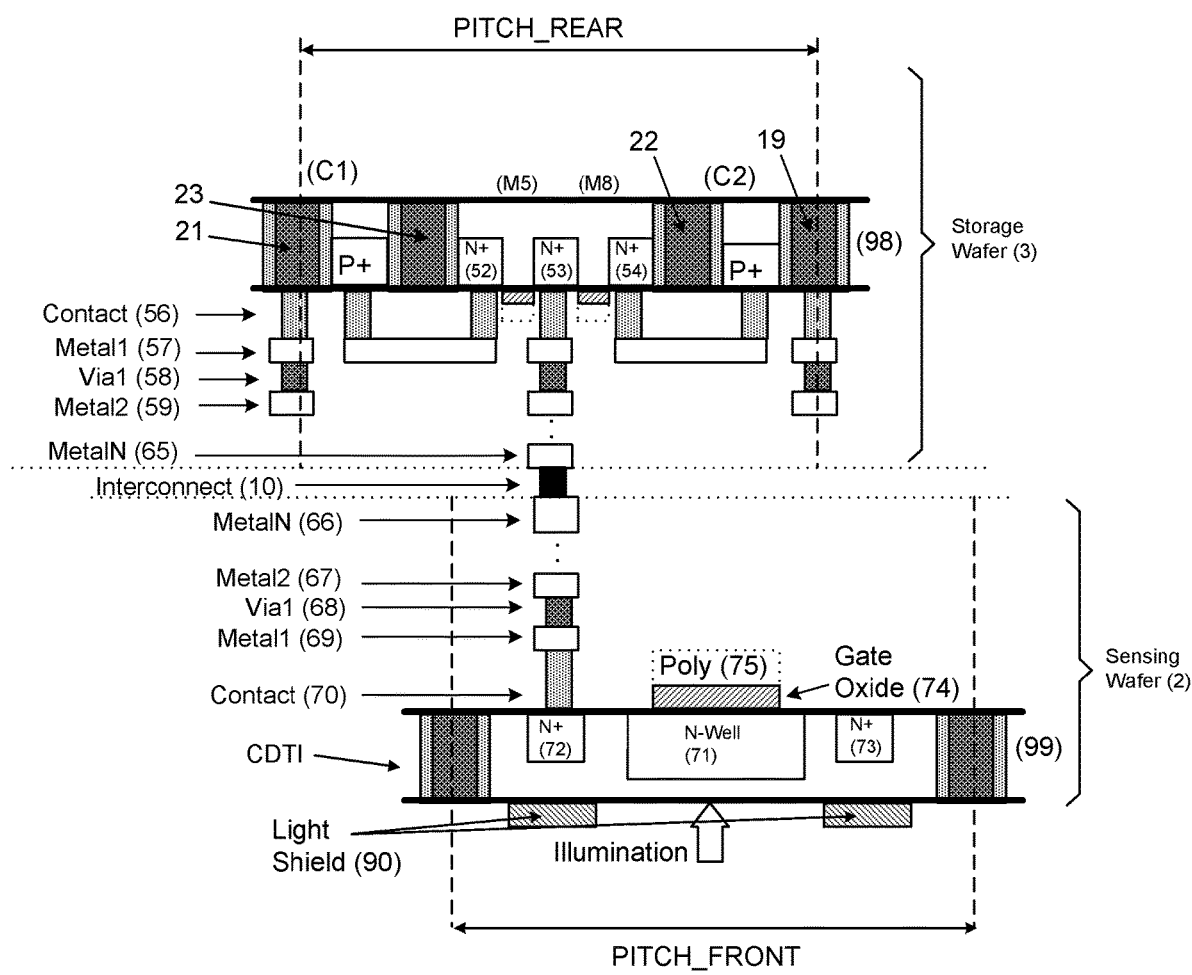
FIG. 8 is a cross sectional view of the sensing wafer and storage wafer of FIG. 2 in which the capacitive deep trench isolations of those wafers are not aligned.

In some applications, such as that shown in in FIG. 8, the capacitive deep trench isolations 21 and 19 of the storage wafer 3 are not aligned with the capacitive deep trench isolations CDTI of the sensing wafer 2. However, in this case, it is noted that the pitch of the storage wafer 3 remains identical to that of the sensing wafer 2.

It should be appreciated that the structures described thus far on the sensing wafer 2 and storage wafer 3 are but one pixel, and that in most applications, the sensing wafer 2 and storage wafer 3 will contain numerous such pixels.

A block view of a sensing wafer 2 containing multiple pixel sensing circuits is shown in FIG. 9A. Here, multiple pixel sensing circuits can be seen on the sensing wafer 2 arranged into a matrix, with their positions to one another noted in terms of cartesian coordinates. Thus, the sensing wafer 2 contains pixel sense (x,y), pixel sense (x+1,y), pixel sense (x+2,y), pixel sense (x,y+1), pixel sense (x+1,y+1), and pixel sense (x+2,y+1). Similarly, multiple storage circuits can be seen on the storage wafer 3, which contains pixel store (x,y), pixel store (x+1,y), pixel store (x+2,y), pixel store (x,y+1), pixel store (x+1,y+1), and pixel store (x+2,y+1). The storage wafer also contains an analog to digital converter (ADC) 7 (from which pixel image values are read out) and its associated ramp generator which here are shown as being solely on one side of the pixel stores.

Figures 10A, 10B:
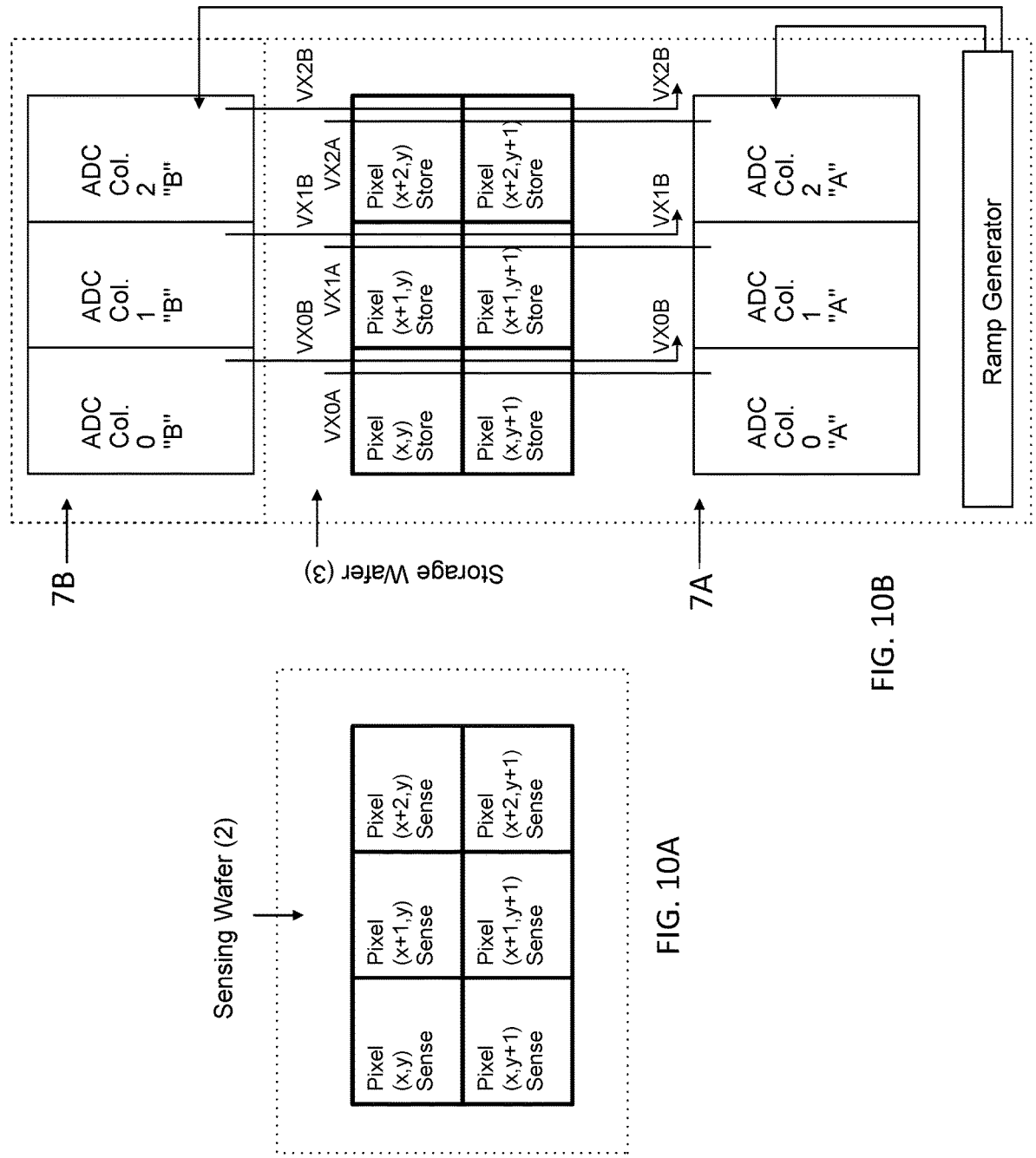
FIG. 10A is a top view block diagram of another design for the sensing wafer of FIG. 2.
FIG. 10B is a top view block diagram of another design for the storage wafer of FIG. 2.

Since the splitting of the pixel circuitry into two wafers frees up area, in some instances, the pitch of the pixel circuitry can be reduced. This reduction in pitch, however, creates some challenges with more complex circuitry, such as the analog to digital converter 7. In order to provide adequate space for the analog to digital converter 7, it may in some cases, such as that shown in FIG. 10B, be split, with some portions of the analog to digital converter 7A being above the pixel stores on the storage wafer 3, and some portions of the analog to digital converter 7B being below the pixel stores on the storage wafer 3.

In other cases, such as that shown in FIGS. 11A-11B, the sensing wafer 2 may contain an analog to digital converter portion 7A below the pixel sense circuitry, while the storage wafer 3 contains the other analog to digital converter portion 7B between the pixel stores. In addition, the sensing wafer 2 has a ramp generator A for the analog to digital converter portion 7A, while the storage wafer 3 has a ramp generator B. This arrangement allows for different ramp swings to be employed, as the bitline associated with one analog to digital converter portion (e.g. 7A or 7B) conveys a black signal (meaning that there is but a small variation in voltage between pixels), while a bit line associated with the other analog to digital converter portion carries an image signal (meaning that there is a large variation in voltage between pixels), and using different swings on the different ramp generators A and B can help address the differences in variation resulting in a pixel output voltage going outside the operating range of one of the analog to digital converter portions 7A or 7B.

Figures 11A, 11B:
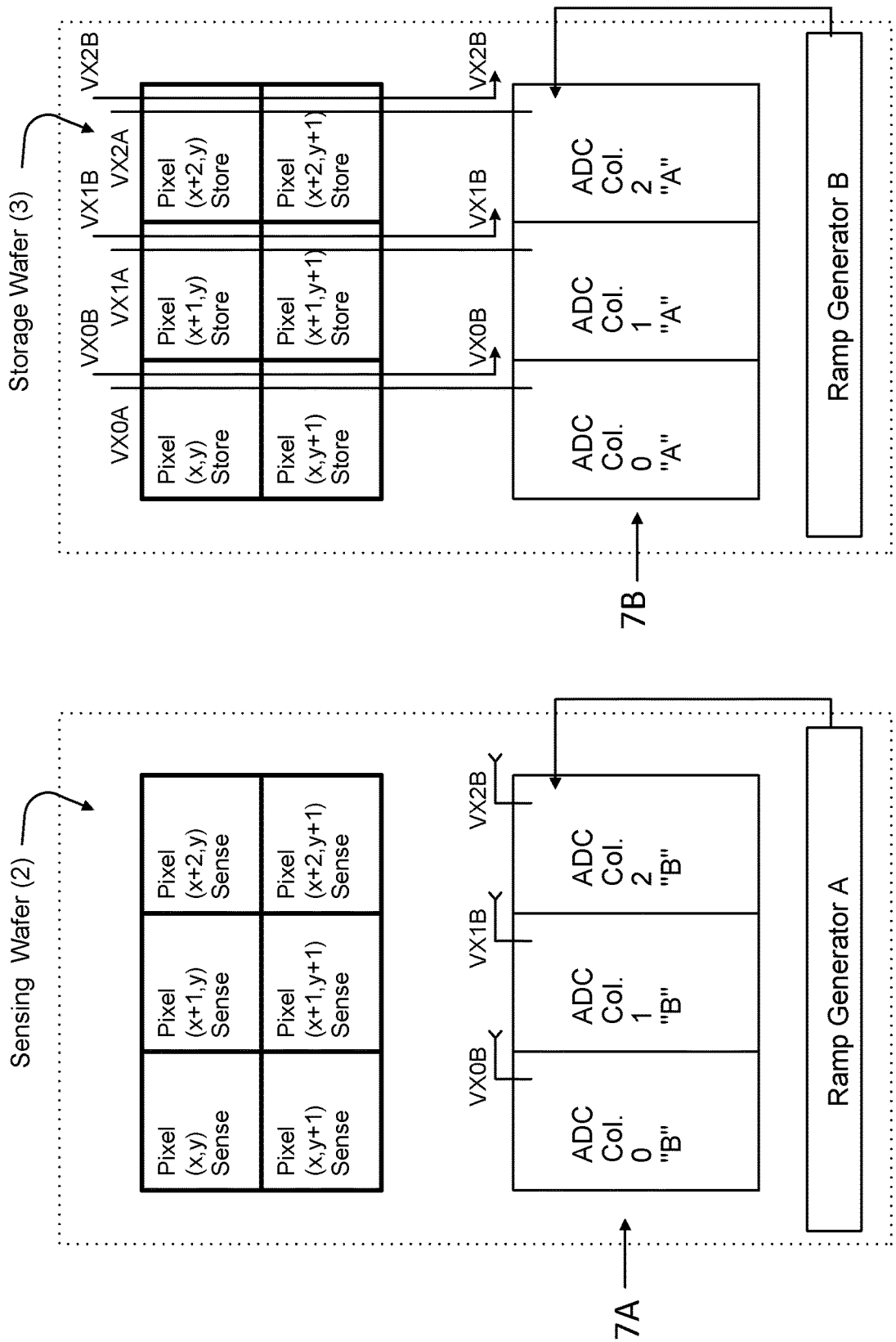
FIG. 11A is a top view block diagram of a further design for the sensing wafer of FIG. 2.
FIG. 11B is a top view block diagram of a further design for the storage wafer of FIG. 2.
Figure 12:
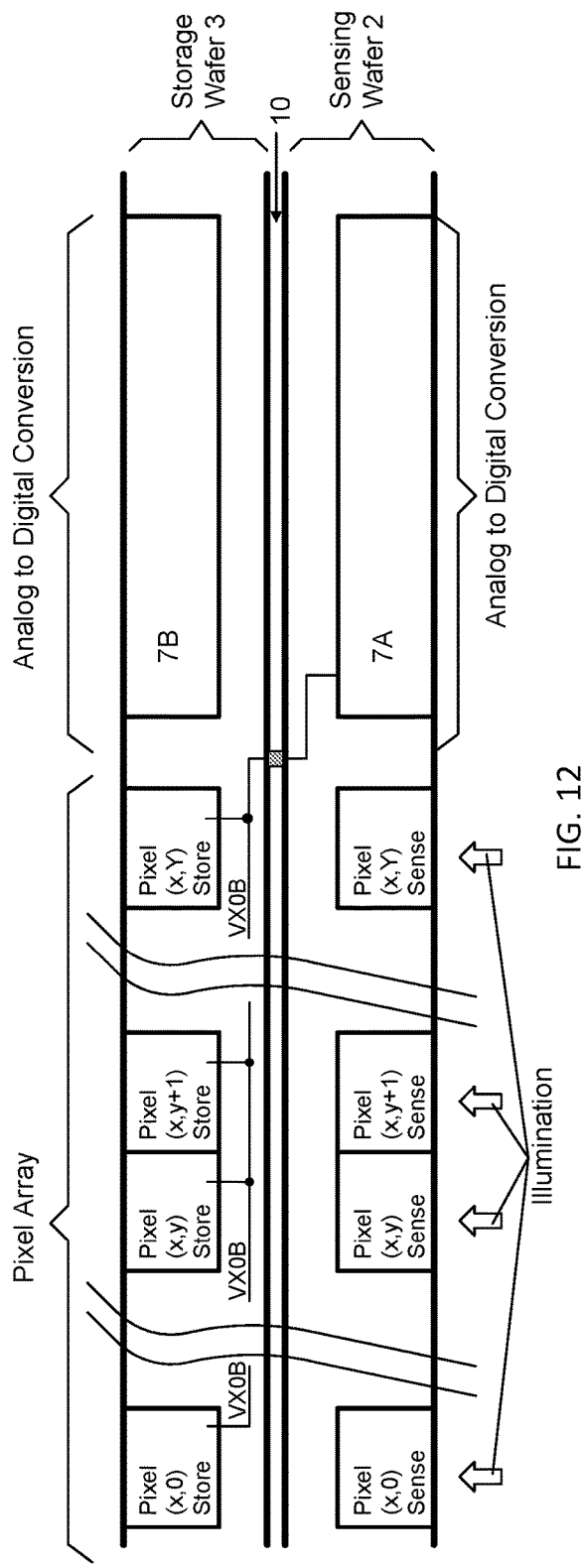
FIG. 12 is a cross sectional view one side of the sensing wafer and storage wafer of FIGS. 11A-11B in a stacked arrangement.
Figure 13:
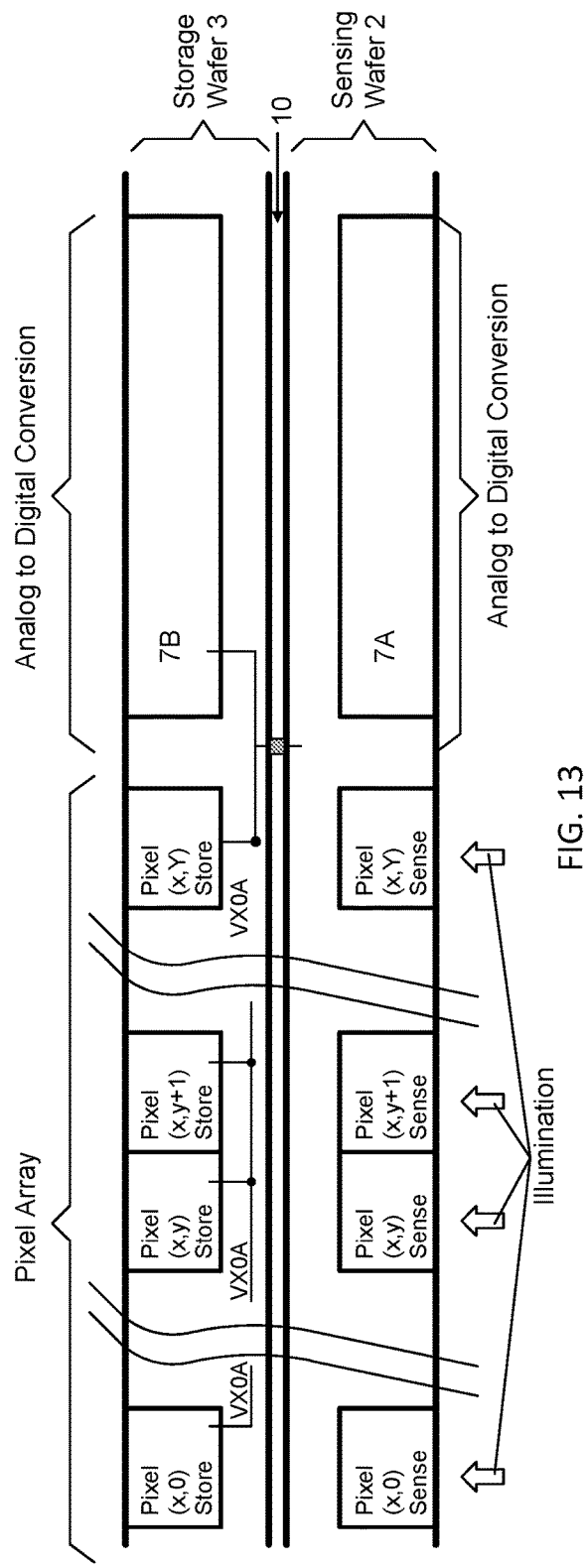
FIG. 13 is a cross sectional view of the other side of the sensing wafer and storage wafer of FIGS. 11A-11B in a stacked arrangement.

A cross sectional view of the embodiment of FIGS. 11A-11B is shown in FIGS. 12-13. FIG. 12 shows how the bitline VX0B is connected to the pixels in a column in the storage wafer 3 and passes through the interconnect 10 to the sensing wafer 2 where it is coupled to the analog to digital converter 7B. There will be a similar arrangement for each column of pixels, which is to say each column of pixels will be connected via an interconnect 10 to an analog to digital converter on the sensing wafer 2. FIG. 13 shows how the bitline VX0A is connected to an analog to digital converter 7B on the storage wafer 3 and this analog to digital converter 7B substantially overlays the analog to digital converter 7A on the sensing wafer 7A. Bitline VX0A is also coupled to the interconnect 10 and the metal on the sensing wafer 2, but not to circuitry on the sensing wafer 2, helping ensure that bitlines VX0A and VX0B have a similar capacitance, as well as other parasitic effects to help ensure a proper match therebetween.

Not shown in FIGS. 9A-9B, 10A-10B, 11A-11B are associated digital logic circuits, such as control signals, recoders, shift registers, and counters. It should be appreciated that these components may be placed on either wafer duplicated in whole or in part as desired in both wafers.

Refering back to FIGS. 2-3, such a global shutter pixel 2 with two storage capacitors C1, C2 can operate in one of two global shutter modes, namely correlated double sampling (CDS) mode and HDR mode (high dynamic range).

In the CDS mode, one capacitor C1 or C2 is used to sample the reset voltage RST (preferably just before the signal is transferred from the photodiode Pd to the floating diffusion capacitor Cfd) and the other capacitor C1 or C2 is used to sample a signal voltage (shortly after the reset voltage RST is sampled and stored, the signal is transferred to the floating diffusion capacitor Cfd). Both these two signals will contain the same amount of "kTC" noise of the floating diffusion capacitor Cfd, and thus by subtracting these two signals, the kTC noise of the floating diffusion capacitor Cfd will be cancelled. kTC noise can be mathematically represented as:

$$V_{kTC} = SQRT\left(\frac{kT}{c}\right)$$

Hence, the noise on C1 will be the sum of the kTC noise of the signal at the floating diffusion capacitor Cfd and C1, and the noise on C2 will be the sum of the kTC noise of the signal at the floating diffusion capacitor Cfd and C2. Mathematically, this can be described as:

$$V_{kTCnoise1} = \sqrt{\left(\left(\frac{kT}{Cfd}\right)^2 + \left(\frac{kT}{C1}\right)^2\right)}$$

$$V_{kTCnoise2} = \sqrt{\left(\left(\frac{kT}{Cfd}\right)^2 + \left(\frac{kT}{C2}\right)^2\right)}$$

Subtracting the two signals will cancel out the kTC noise of the signal at the floating diffusion capacitor Cfd, but the drawback is that this adds the kTC noise to the signals at capacitors C1 and C2. This can be represented as:

$$V_{kTCdifference} = \sqrt{\left(\left(\frac{kT}{C1}\right)^2 + \left(\frac{kT}{C2}\right)^2\right)}$$

In the HDR mode, it is possible to expose the pixel to light twice, for different exposure times and store two different exposures on each of the two capacitors C1 and C2. The signal from the first exposure can be represented mathematically as:

$$V_{Swing1} = I_{photo} \times \frac{t_{int1}}{Cfd} \pm V_{kTCnoise1}$$

The signal from the second exposure can be represented as:

$$V_{Swing2} = I_{photo} \times \frac{t_{int2}}{Cfd} \pm V_{kTCnoise2}$$

The $V_{Swing}$ voltages are the change on the sense node from the reset voltage, where $V_{kTCnoise}$ are the noises as calculated above. However as the signal at the floating diffusion capacitor Cfd is reset between each exposure, the noise becomes different and a separate sampling of the reset noise may be helpful for each case.

To implement this, an alternative design for the pixel 1 includes four storage capacitors. The storage capacitors C1, C2, C3, and C4 can then be used to store two image values and two reset values so that CDS can be performed on each of the acquired images. The four storage capacitors C1, C2, C3, C4 are all formed from capacitive deep trench isolations. These capacitors and their associated transistors may be located on the storage wafer 3, or, as both wafers 2 and 3 have capacitive deep trench isolations, the capacitors C1, C2, C3, C4 may be more efficiently divided between the two wafers.

Figure 14:
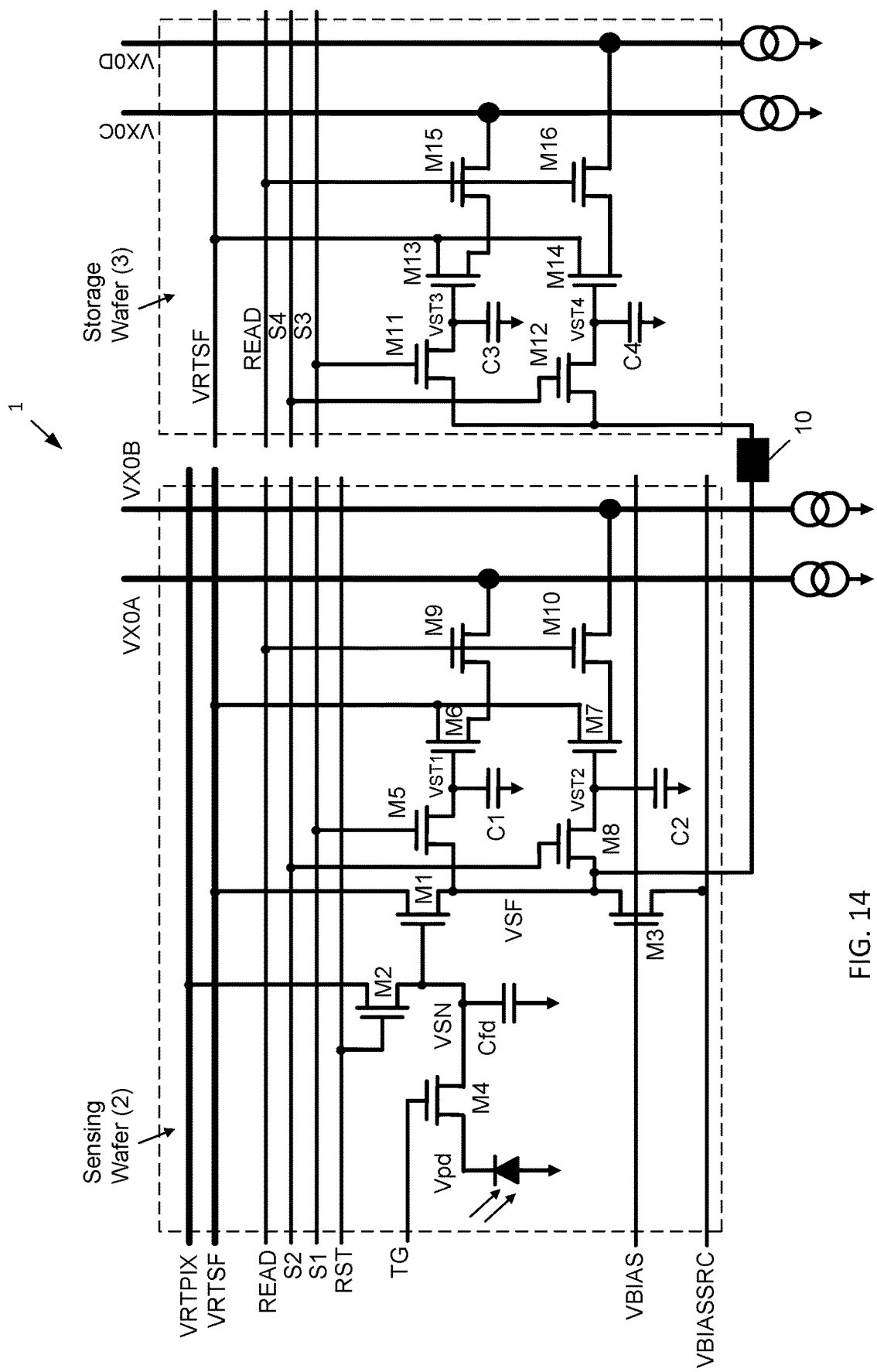
FIG. 14 is a circuit diagram of an alternative pixel architecture circuit similar to that of FIG. 2 but in which there are four storage capacitors.

Such an embodiment is shown in FIG. 14. Here, the sensing wafer 2 appears as a ten transistor sensing pixel with storage capacitors C1 and C2, and transistors M1-M10, similar to FIG. 1. The storage wafer 3 contains transistors M11, M12 which act as transfer gates to selectively transfer the signal from source-follower M1 to storage capacitors C3 and C4. Transistors M13, M14 act as source-followers, following the voltage across the storage capacitors C3 and C4. Transistors M15, M16 are used as switches and, when enabled, allow the voltage at the source of M1 to be stored across the capacitors C3, C4. There are also four independent bitlines (VX0A, VX0B, VX0C, VX0D), each enabled by a single READ signal. This signal may be electrically coupled via the interconnection 10, or may be generated separately in each wafer by an independent set of control logic.

Transistor M3 is shown in FIG. 14 as being on the sensing wafer 2, but may be located (together with the conductors VBIAS and VBIASSRC) on the storage wafer 3 in some cases.

In a variation, it would be possible to have but two bitlines by having an extra READ control line per row such that transistors M7 and M10 having a common bitline have separate read signals.

The implementations described thus far have implemented photodetection using the photodiode Pd as fabricated in the sensing wafer 2. However, in some cases, the photodiode can be implemented in an organic photoconductive film.

Figure 15:
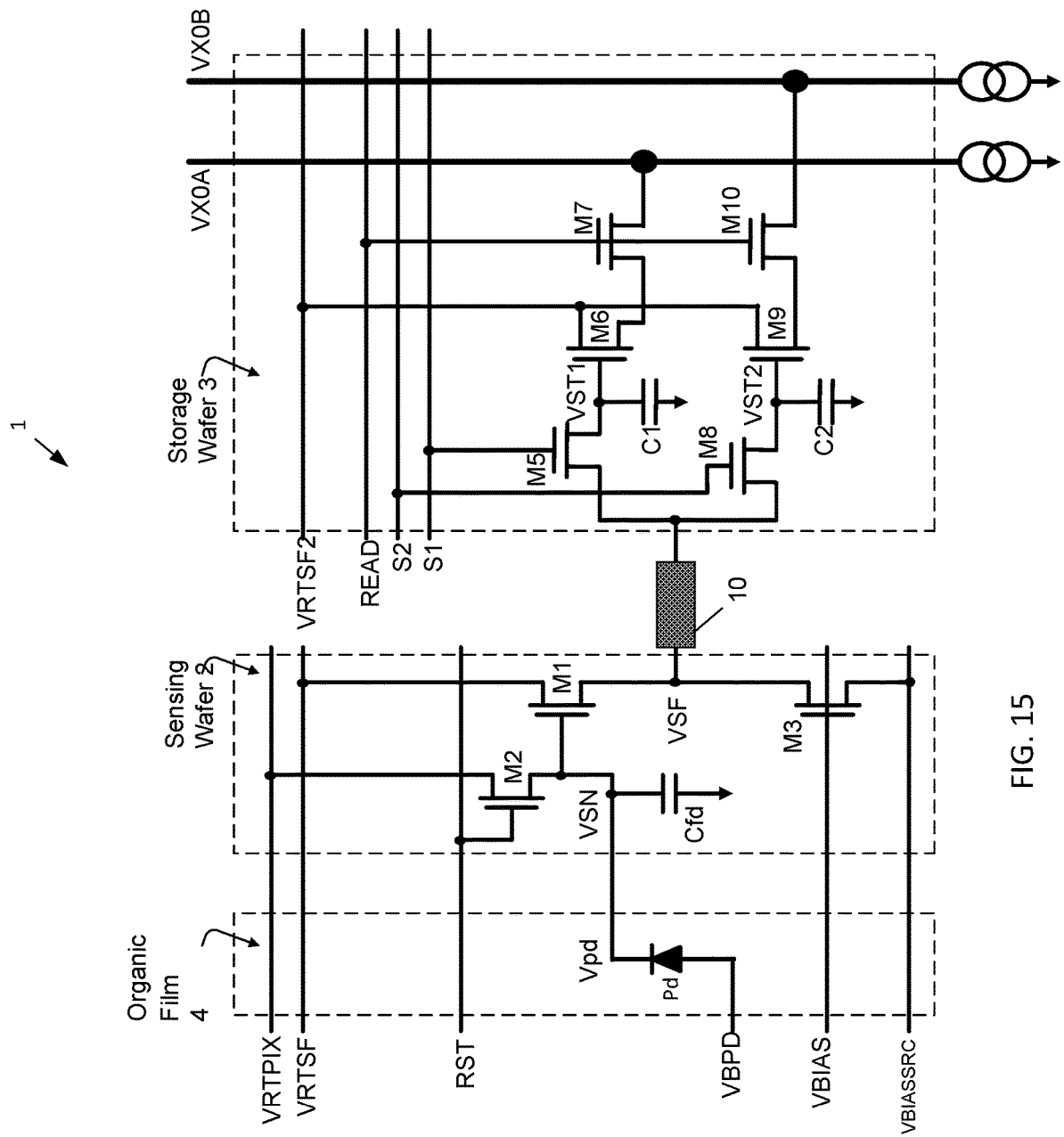
FIG. 15 is a circuit diagram of a pixel architecture circuit similar to that of FIG. 2 but in which the photodiodes are on a separate thin organic film.

Such an embodiment is shown in FIG. 15. Here, the photodiode PD is implemented on an organic photodiode film 4 coupled to the sensing wafer 2, which contains transistors M1-M3 and floating diffusion capacitor Cfd. The storage wafer 3 here remains the same as in FIGS. 2-3, and also here it should be noted that bias transistor M3 may be located on the storage wafer 3 instead of the sensing wafer 2 in some cases.

As should be appreciated, a photodiode implemented on an organic photodiode film cannot be fully depleted and suffers from kTC noise. This four capacitor design addresses this drawback, as having two independent storage elements in each pixel allows for cancellation of reset noise as the signal passed by the source-follower M1 after reset (which includes kTC noise) can be stored on one of the capacitors and subtracted from the signal passed by the source-follower M1 at the end of integration.

Having the photodiode implemented on a separate layer provides for increased quantum efficiency, although it does bring with it the drawback of a less favorable dark current. This also provides for space savings on the sensing wafer 2, enabling reduction of pixel pitch or the addition of additional circuit elements.

Figure 16:
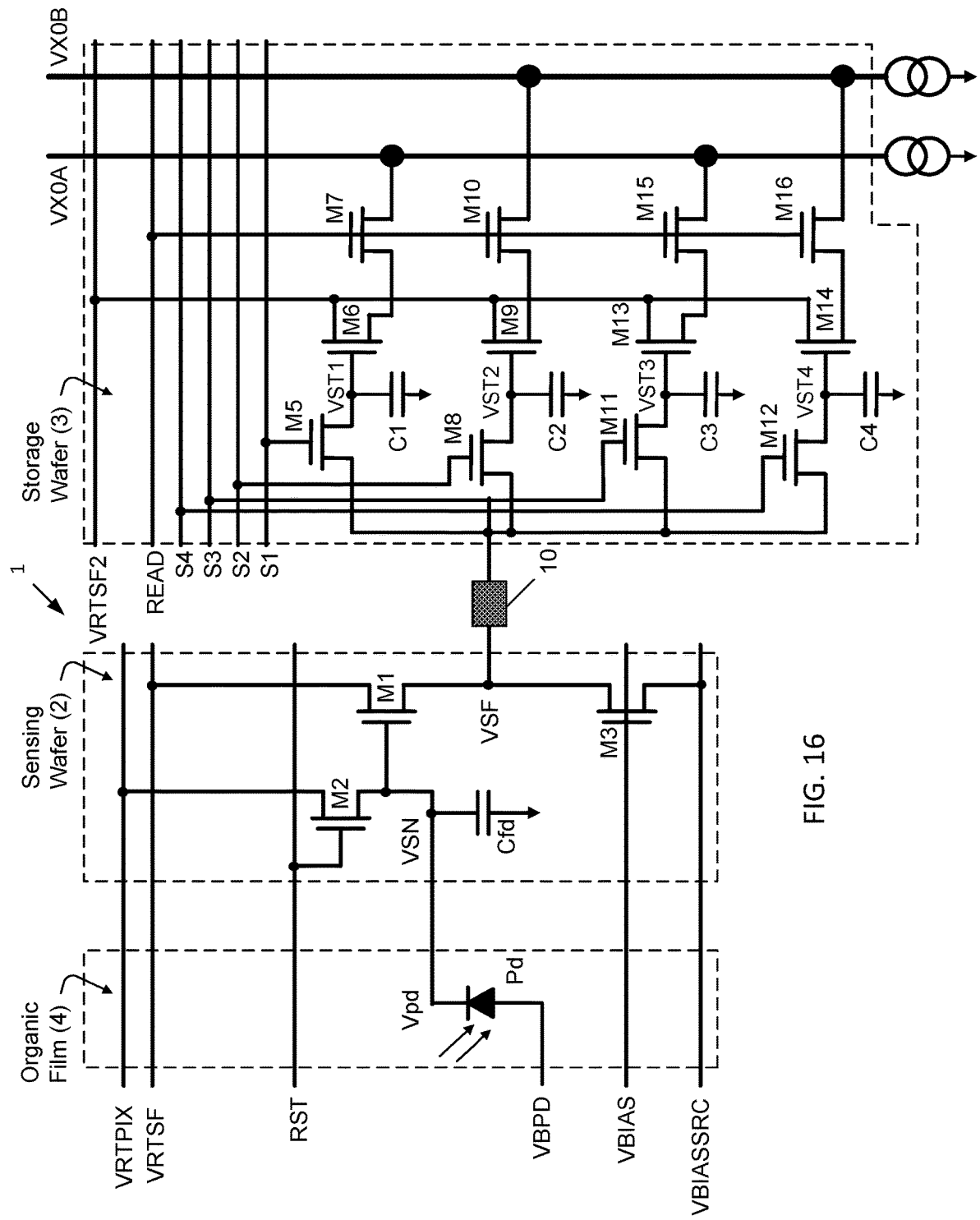
FIG. 16 is a circuit diagram of an alternative pixel architecture circuit similar to that of FIG. 2 but in which there are four storage capacitors on the storage wafer and in which the photodiodes are on a separate thin organic film.

Another embodiment employing an organic photodiode film is shown in FIG. 16. Here, the photodiode PD is implemented on an organic photodiode film 4 coupled to the sensing wafer 2, as in FIG. 15. Differently here, storage wafer 3 contains four storage capacitors C1, C2, C3, C4 and their associated transistors M5-M16. The functions of the transistors M5-M16 are as described above with reference to FIG. 14.

Since there are no storage capacitors on the sensing wafer 2, here it would be possible to build the sensing wafer from a simpler process technology that does not involve the capacitive deep trench isolations used to form the storage capacitors C1, C2, C3, C4 on the storage wafer 3.

Figure 17:
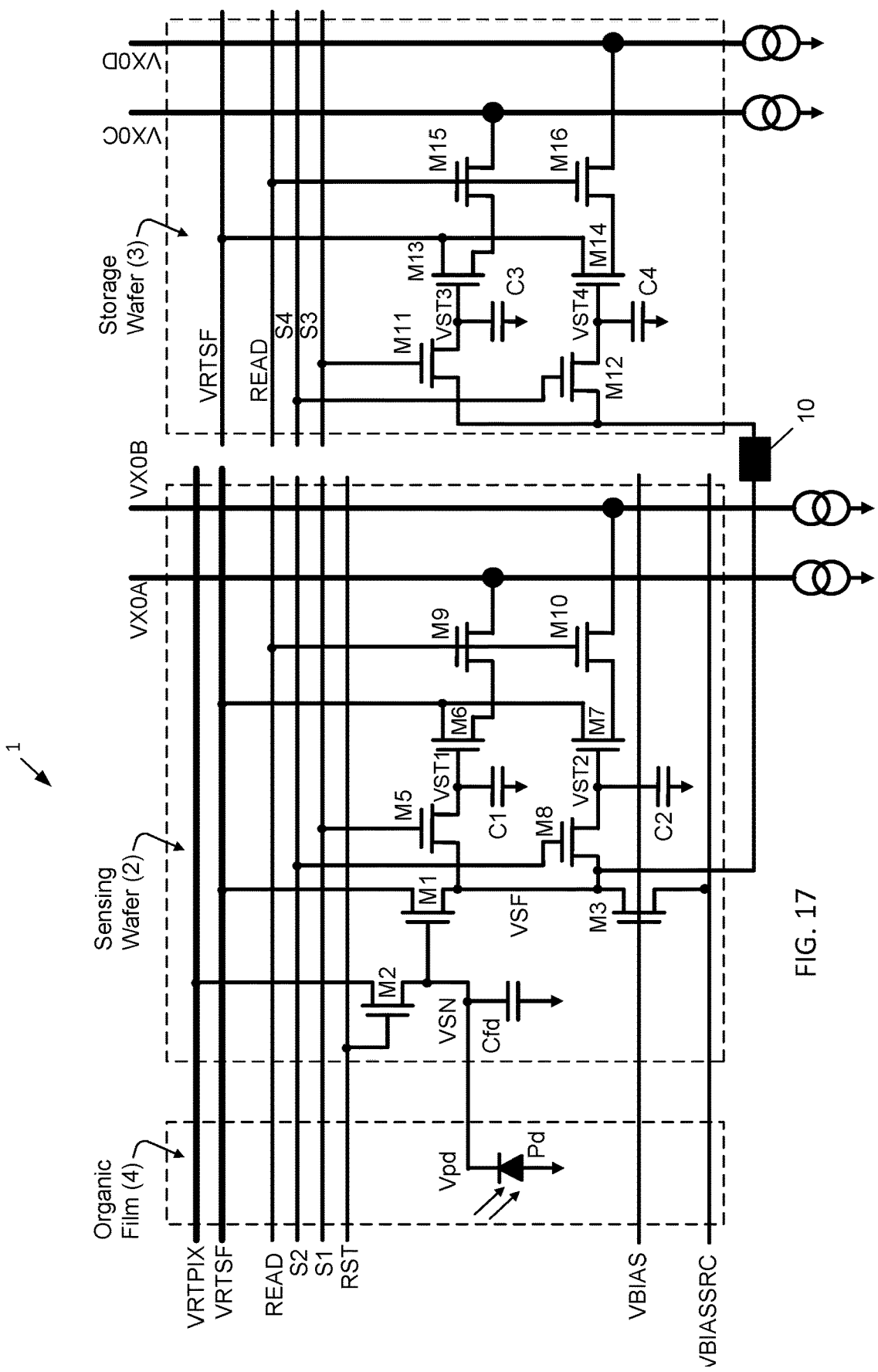
FIG. 17 is a circuit diagram of another alternative pixel architecture circuit similar to that of FIG. 2 but in which there are four storage capacitors, two on the sensing wafer and two on the storage wafer, and in which the photodiodes are on a separate thin organic film.
Figure 18:
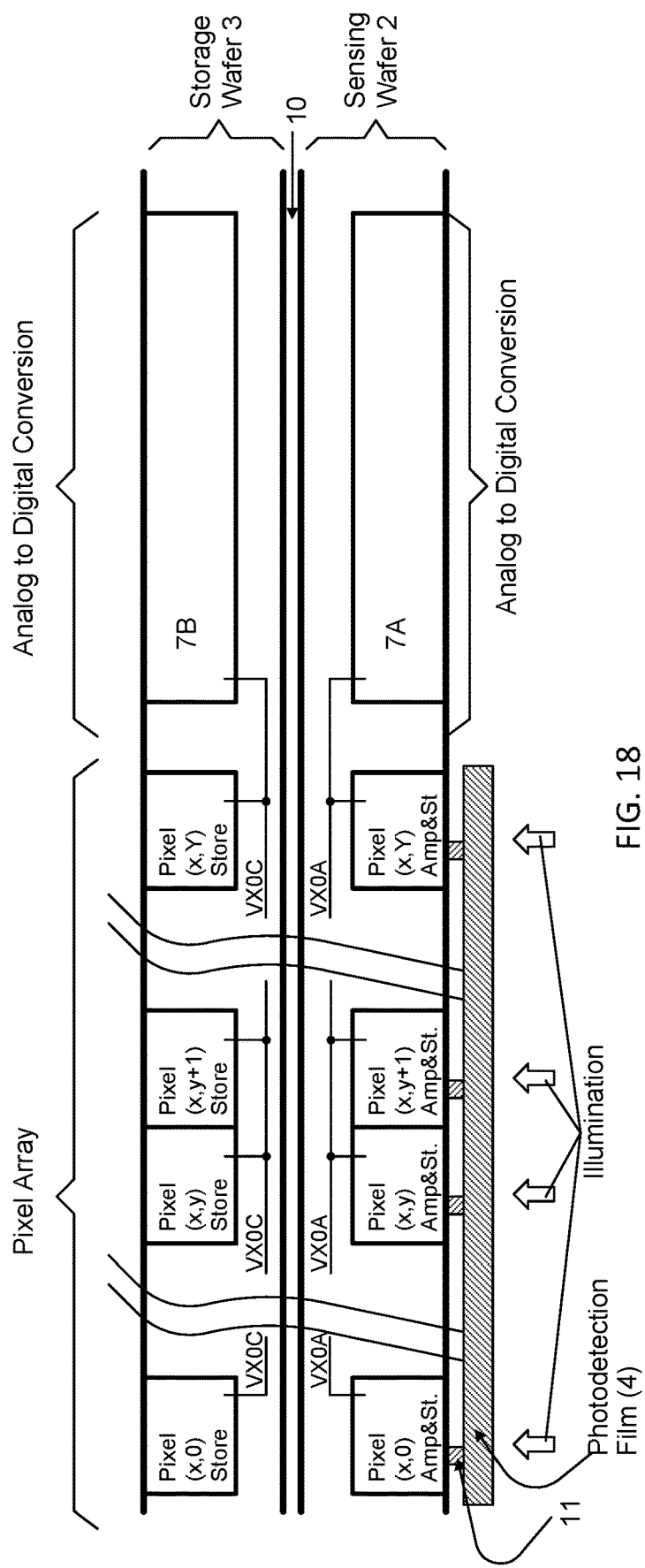
FIG. 18 is a cross sectional view of the thin organic film, sensing wafer, and storage wafer of FIG. 17.

Another embodiment utilizing a organic photodiode film is shown in FIG. 17. Here, as in FIG. 13, there are four storage capacitors C1, C2, C3, and C4 split between the sensing wafer 2 and storage wafer 3 together with their respective transistors, but differently, the photodiode PD is implemented on an organic photodiode film 4. The bias transistor M3 and conductor VBIASSRC may be on either the sensing wafer 2 or storage wafer 3. The capacitors C1, C2, C3, and C4 are available to store two separate exposures (e.g. HDR, multispectral or multi-exposure) as well as kTC cancellation for each exposure. As the wafers are stacked, a small pixel size (e.g. 2.0 µm), is available with large storage capacitors (e.g. 20 fF) resulting in high performance and functionality. A cross section of this embodiment can be seen in FIG. 18, which illustrates the additional interconnection layer 11 coupling the organic photodiode film 4 to the sensing wafer 2.

It should be understood that the prior teachings are in no way limited to the specific transistor and capacitor structures shown, and that this disclosure contemplates any and all types of transistor and capacitor structures.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
a first integrated circuit die having formed therein at least one photodiode and readout circuitry configured to convert charge generated by the at least one photodiode to a read voltage and to selectively output the read voltage;
a second integrated circuit die in a stacked arrangement with the first integrated circuit die and having formed therein storage circuitry configured to selectively transfer the read voltage to at least one storage capacitor for storage as a stored voltage and to selectively transfer the stored voltage to an output, the at least one storage capacitor being formed from a capacitive deep trench isolation; and
an interconnect between the first and second integrated circuit dies for coupling the readout circuitry to the storage circuitry.

2. The electronic device of claim 1, wherein:
the readout circuitry formed in the first integrated circuit die comprises:
a floating diffusion capacitor;
a transfer gate transistor configured to selectively transfer charge generated by the at least one photodiode to the floating diffusion capacitor as the read voltage;
a first source follower configured to stabilize and output the read voltage; and
an active load transistor coupled between the first source follower and a bias voltage; and
the storage circuitry formed in the second integrated circuit die comprises:
at least one storage capacitor;
a switch transistor configured to transfer the read voltage output by the first source follower to the at least one storage capacitor as a stored voltage; and
a second source follower configured to stabilize and output the stored voltage to the output.

3. The electronic device of claim 2, wherein the readout circuitry formed in the first integrated circuit die further comprises first and second storage capacitors, a switch transistor configured to transfer the read voltage output by the first source follower to the first and second storage capacitors as a stored voltage, and a third source follower configured to stabilize and output the stored voltage at the first and second storage capacitors to the output; and wherein the at least one storage capacitor formed in the second integrated circuit die comprises third and fourth storage capacitors.

4. The electronic device of claim 1, wherein:
the readout circuitry formed in the first integrated circuit die comprises:
a floating diffusion capacitor;
a transfer gate transistor configured to selectively transfer charge generated by the at least one photodiode to the floating diffusion capacitor as the read voltage;
a first source follower configured to stabilize and output the read voltage; and
an active load transistor coupled between the first source follower and a bias voltage; and
the storage circuitry formed in the second integrated circuit die comprises:
first, second, third, and fourth storage capacitors;
first, second, third, and fourth switch transistors respectively configured to transfer the read voltage output by the first source follower to the first, second, third, and fourth storage capacitors as a stored voltage; and
second, third, fourth, and fifth source followers respectively configured to stabilize and output the stored voltage from the first, second, second, and third storage capacitors to the output.

5. The electronic device of claim 1, wherein:
the readout circuitry formed in the first integrated circuit die comprises:
a floating diffusion capacitor;
a transfer gate transistor configured to selectively transfer charge generated by the at least one photodiode to the floating diffusion capacitor as the read voltage; and
a first source follower configured to stabilize and output the read voltage to the interconnect; and the storage circuitry formed in the second integrated circuit die comprises:
an active load transistor coupled between the interconnect and a bias voltage;
at least one storage capacitor;
a switch transistor configured to transfer the read voltage output by the first source follower to the at least one storage capacitor as a stored voltage; and
a second source follower configured to stabilize and output the stored voltage to the output.

6. The electronic device of claim 1, wherein the first integrated circuit die has a semiconductor substrate with front and back surfaces, and a series of metallizations forming part of the interconnect on the front surface to thereby define a top surface; wherein the second integrated circuit die has a semiconductor substrate with front and back surfaces, and a series of metallizations forming a remainder of the interconnect on the front surface to thereby define a top surface; and wherein the top surfaces of the first and second integrated circuit die face one another, and are electrically coupled to each other by the interconnect.

7. The electronic device of claim 1, wherein the second integrated circuit die lacks readout circuitry for the at least one photodiode, and lacks at least one photodiode formed therein; and wherein the first integrated circuit die lacks the storage circuitry.

8. The electronic device of claim 1, wherein the interconnect comprises at least one conductive bump.

9. The electronic device of claim 1, wherein the storage circuitry formed on the second integrated circuit die includes first and second storage capacitors; wherein the second integrated circuit die has formed therein:
adjacent first and second storage capacitor areas within which the first and second storage capacitors are respectively located;
first and second capacitive deep trench isolations respectively surrounding the first and second storage capacitors areas so as to electrically isolate the first and second storage capacitors from one another; and
wherein the first and second capacitive deep trench isolations share a common wall.

10. The electronic device of claim 9, wherein the first integrated circuit die has a semiconductor substrate with front and back surfaces, and a series of metallizations forming part of the interconnect on the front surface to thereby define a top surface; wherein the second integrated circuit die has a semiconductor substrate with front and back surfaces, and a series of metallizations forming a remainder of the interconnect on the front surface to thereby define a top surface; wherein the top surfaces of the first and second integrated circuit die face one another, and are electrically coupled to each other by the interconnect; wherein the first integrated circuit die has formed therein a readout circuitry area within which the at least one photodiode and readout circuitry are located, with a capacitive deep trench isolation surrounding the readout circuitry area; and wherein the top surfaces of the first and second integrated circuit dies are aligned such that the capacitive deep trench isolation of the first integrated circuit die is at least partially aligned with the first and second capacitive deep trench isolations.

11. The electronic device of claim 9, wherein the first integrated circuit die has a semiconductor substrate with front and back surfaces, and a series of metallizations forming part of the interconnect on the front surface to thereby define a top surface; wherein the second integrated circuit die has a semiconductor substrate with front and back surfaces, and a series of metallizations forming a remainder of the interconnect on the front surface to thereby define a top surface; wherein the top surfaces of the first and second integrated circuit die face one another, and are electrically coupled to each other by the interconnect; wherein the first integrated circuit die has formed therein a readout circuitry area within which the at least one photodiode and readout circuitry are located, with a capacitive deep trench isolation surrounding the readout circuitry area; and wherein the top surfaces of the first and second integrated circuit dies are aligned such that the capacitive deep trench isolation of the first integrated circuit die is unaligned with the first and second capacitive deep trench isolations.

12. The electronic device of claim 9, wherein the first capacitive deep trench isolation is rectangularly shaped, having first and second opposing sides and first and second opposing ends extending between the first and second sides, to contain the first storage capacitor area therein and to electrically isolate the first storage capacitor area from the second storage capacitor area; wherein the second capacitive deep trench isolation is rectangularly shaped, having first and second opposing sides and first and second opposing ends extending between the first and second sides, to contain the second storage capacitor area therein and to electrically isolate the second storage capacitor area from the first storage capacitor area; and wherein the second side of the first capacitive deep trench isolation is the first side of the second capacitive deep trench isolation.

13. The electronic device of claim 1, wherein the storage circuitry formed on the second integrated circuit die includes first and second storage capacitors; and wherein the second integrated circuit die has formed therein:
spaced apart first and second storage capacitor areas within which the first and second storage capacitors are respectively located;
first and second capacitive deep trench isolations respectively surrounding the first and second storage capacitors areas so as to electrically isolate the first and second storage capacitors from one another;
a storage circuitry area between the first and second storage capacitor areas and separating the first and second storage capacitor areas from one another; and
a third capacitive deep trench isolation surrounding the storage circuitry area so as to electrically isolate the storage circuitry area from the first and second storage capacitors;
wherein the first and third capacitive deep trench isolations share a common wall;
wherein the second and third capacitive deep trench isolations share a common wall.

14. The electronic device of claim 13, wherein the first integrated circuit die has a semiconductor substrate with front and back surfaces, and a series of metallizations forming part of the interconnect on the front surface to thereby define a top surface; wherein the second integrated circuit die has a semiconductor substrate with front and back surfaces, and a series of metallizations forming a remainder of the interconnect on the front surface to thereby define a top surface; wherein the top surfaces of the first and second integrated circuit die face one another, and are electrically coupled to each other by the interconnect; wherein the first integrated circuit die has formed therein a readout circuitry area within which the at least one photodiode and readout circuitry are located, with a capacitive deep trench isolation surrounding the readout circuitry area; and wherein the top surfaces of the first and second integrated circuit dies are aligned such that the capacitive deep trench isolation of the first integrated circuit die is at least partially aligned with outside perimeters of the first, second, and third capacitive deep trench isolations.

15. The electronic device of claim 13, wherein the first integrated circuit die has a semiconductor substrate with front and back surfaces, and a series of metallizations forming part of the interconnect on the front surface to thereby define a top surface; wherein the second integrated circuit die has a semiconductor substrate with front and back surfaces, and a series of metallizations forming a remainder of the interconnect on the front surface to thereby define a top surface; wherein the top surfaces of the first and second integrated circuit die face one another, and are electrically coupled to each other by the interconnect; wherein the first integrated circuit die has formed therein a readout circuitry area within which the at least one photodiode and readout circuitry are located, with a capacitive deep trench isolation surrounding the readout circuitry area; and wherein the top surfaces of the first and second integrated circuit dies are aligned such that the capacitive deep trench isolation of the first integrated circuit die is unaligned with outside perimeters of the first, second, and third capacitive deep trench isolations.

16. The electronic device of claim 1, wherein the second integrated circuit die includes an analog to digital converter located adjacent a first side of the storage circuitry but not adjacent a second side of the storage circuitry opposite the first side.

17. The electronic device of claim 1, wherein the second integrated circuit die includes a first analog to digital converter portion located adjacent a first side of the storage circuitry and a second analog to digital converter portion located adjacent a second side of the storage circuitry opposite the first side.

18. The electronic device of claim 1, wherein the second integrated circuit die includes a first analog to digital converter portion located adjacent a first side of the storage circuitry but not adjacent a second side of the storage circuitry opposite the first side; and wherein the first integrated circuit die includes a second analog to digital converter portion located adjacent a first side of the readout circuitry but not adjacent a second side of the readout circuitry opposite the first side thereof.

19. The electronic device of claim 18, wherein, in the stacked arrangement, the first analog to digital converter portion faces the second analog to digital converter portion.

20. The electronic device of claim 18, wherein the second integrated circuit die includes a first ramp generator for the first analog to digital converter portion; wherein the first integrated circuit die includes a second ramp generator for the second analog to digital converter portion; and wherein the first ramp generator has a different gain than the second ramp generator.

21. The electronic device of claim 1, wherein the first integrated circuit die has formed therein second storage circuitry configured to selectively transfer the read voltage to at least one second storage capacitor for storage as a stored voltage and to selectively transfer the stored voltage to an output, the at least one second storage capacitor being formed from a capacitive deep trench isolation.

22. An electronic device, comprising:
a film having formed therein at least one photodiode;
a first integrated circuit die having formed therein readout circuitry configured to convert charge generated by the at least one photodiode to a read voltage and to selectively output the read voltage;
a first interconnect between the film and the first integrated circuit die for coupling the at least one photodiode to the readout circuitry;
a second integrated circuit die in a stacked arrangement with the first integrated circuit die and having formed therein storage circuitry configured to selectively transfer the read voltage to at least one storage capacitor for storage as a stored voltage and to selectively transfer the stored voltage to an output, the at least one storage capacitor being formed from a capacitive deep trench isolation; and
a second interconnect between the first and second integrated circuit dies for coupling the readout circuitry to the storage circuitry.

23. The electronic device of claim 22, wherein:
the readout circuitry formed in the first integrated circuit die comprises:
a floating diffusion capacitor;
a transfer gate transistor configured to selectively transfer charge generated by the at least one photodiode to the floating diffusion capacitor as the read voltage;
a first source follower configured to stabilize and output the read voltage; and
the storage circuitry formed in the second integrated circuit die comprises:
first, second, third, and fourth storage capacitors;
first, second, third, and fourth switch transistors respectively configured to transfer the read voltage output by the first source follower to the first, second, third, and fourth storage capacitors as a stored voltage;
second, third, fourth, and fifth source followers respectively configured to stabilize and output the stored voltage from the first, second, second, and third storage capacitors to the output.

24. The electronic device of claim 22, wherein:
the readout circuitry formed in the first integrated circuit die comprises:
a floating diffusion capacitor;
a transfer gate transistor configured to selectively transfer charge generated by the at least one photodiode to the floating diffusion capacitor as the read voltage;
a first source follower configured to stabilize and output the read voltage;
an active load transistor coupled between the first source follower and a bias voltage; and
the storage circuitry formed in the second integrated circuit die comprises:
at least one storage capacitor;
a switch transistor configured to transfer the read voltage output by the first source follower to the at least one storage capacitor as a stored voltage;
a second source follower configured to stabilize and output the stored voltage to the output.

25. The electronic device of claim 24, wherein the readout circuitry formed in the first integrated circuit die further comprises first and second storage capacitors, a switch transistor configured to transfer the read voltage output by the first source follower to the first and second storage capacitors as a stored voltage, and a third source follower configured to stabilize and output the stored voltage at the first and second storage capacitors to the output; and wherein the at least one storage capacitor formed in the second integrated circuit die comprises third and fourth storage capacitors.

* * * * *